US009541398B2

(12) United States Patent
Overstreet, II

(10) Patent No.: US 9,541,398 B2
(45) Date of Patent: Jan. 10, 2017

(54) CHIP-SCALE ATOMIC GYROSCOPE

(71) Applicant: Microsemi Corporation, Aliso Viejo, CA (US)

(72) Inventor: Kim Richard Overstreet, II, Beverly, MA (US)

(73) Assignee: MICROSEMI CORPORATION, Aliso Viejo, CA (US)

( * ) Notice: Subject to any disclaimer, the term of this patent is extended or adjusted under 35 U.S.C. 154(b) by 314 days.

(21) Appl. No.: 14/542,844

(22) Filed: Nov. 17, 2014

(65) Prior Publication Data

US 2015/0369604 A1 Dec. 24, 2015

Related U.S. Application Data

(63) Continuation-in-part of application No. 14/250,059, filed on Apr. 10, 2014.

(60) Provisional application No. 61/810,471, filed on Apr. 10, 2013.

(51) Int. Cl.
*G01V 3/00* (2006.01)
*G01C 19/62* (2006.01)
*G01R 33/26* (2006.01)

(52) U.S. Cl.
CPC ............ *G01C 19/62* (2013.01); *G01R 33/26* (2013.01)

(58) Field of Classification Search
CPC ................................................ G01R 33/26
USPC ................................ 324/301, 302, 304, 305
See application file for complete search history.

(56) References Cited

U.S. PATENT DOCUMENTS

| 3,778,700 | A | 12/1973 | Bayley et al. |
| 4,461,996 | A | 7/1984 | Kwon |
| 7,239,135 | B2 | 7/2007 | Abbink et al. |
| 7,282,910 | B1 | 10/2007 | Kanegsberg |
| 7,359,059 | B2 | 4/2008 | Lust et al. |
| 7,863,894 | B2 | 1/2011 | Hall |
| 7,872,473 | B2 | 1/2011 | Kitching et al. |
| 8,159,220 | B2 | 4/2012 | Bulatowicz et al. |
| 8,212,556 | B1 | 7/2012 | Schwindt et al. |

(Continued)

OTHER PUBLICATIONS

International Search Report for PCT Application No. PCT/US2014/067627, dated Mar. 27, 2015.

(Continued)

*Primary Examiner* — Louis Arana
(74) *Attorney, Agent, or Firm* — Patterson & Sheridan, LLP

(57) ABSTRACT

Apparatuses and methods for sensing rotations are provided. One embodiment provides an apparatus including a cell containing alkali and active nuclear magnetic resonance (NMR) isotope(s) atoms, a magnet providing a first magnetic field, a light source emitting diverging light that passes through the cell, and optics which circularly polarize the diverging light. A longitudinal component of the diverging light optically pumps the alkali atoms and, in conjunction with a second magnetic field orthogonal to the first magnetic field or a modulation of the diverging light, causes the alkali and NMR isotope atoms to precess about the first field. A transverse component of the diverging light acts as a probe beam for observing the precession. The apparatus further includes a polarizing beam splitter to split light that has passed through the cell into orthogonally polarized components detected by respective photodetectors and used to determine rotations relative to an inertial frame.

17 Claims, 10 Drawing Sheets

(56) References Cited

U.S. PATENT DOCUMENTS

| | | | | |
|---|---|---|---|---|
| 8,334,690 B2* | 12/2012 | Kitching | ............ | G01R 33/0286 |
| | | | | 324/301 |
| 2011/0101974 A1 | 5/2011 | Nagasaka | | |
| 2014/0375313 A1* | 12/2014 | Salit | ...................... | G01R 33/26 |
| | | | | 324/301 |

OTHER PUBLICATIONS

Donley, E.A.; "Nuclear Magnetic Resonance Gyroscopes"; Sensors, 2010 IEEE, IEEE, Piscataway, NJ.; Nov. 1, 2010, pp. 17-22.
International Search Report, for PCT Application No. PCT/US2014/0033689, dated Jan. 12, 2015.

* cited by examiner

CHIP-SCALE ATOMIC GYROSCOPE

CROSS-REFERENCE TO RELATED APPLICATIONS

This application is a continuation-in-part of co-pending U.S. patent application Ser. No. 14/250,059, entitled "Chip-Scale Atomic Gyroscope" and filed on Apr. 10, 2014, which claims benefit of U.S. provisional application having Ser. No. 61/810,471, filed on Apr. 10, 2013. Each of the aforementioned related patent applications is herein incorporated by reference.

BACKGROUND OF THE INVENTION

Field of the Invention

Embodiments disclosed herein relate generally to atomic sensing devices, and more specifically, to a chip-scale atomic gyroscope or magnetometer.

Description of the Related Art

Gyroscopes are devices that may be used to sense rotations of objects. Gyroscopes have applications in many areas including navigation, where, combined with accelerometer data, rotations sensed via gyroscopes may help provide the positions of airplanes, submarines, satellites, and the like, without having to rely on the Global Positioning System (GPS).

Traditionally, gyroscopes having high performance in terms of, e.g., bias stability and low angle random walk (ARW), have been large, expensive, and power-hungry. For example, some gyroscopes currently in use are lunchbox-sized devices that cost tens of thousands of dollars to manufacture. The size, expense, and power requirements of such devices are significant drawbacks that limit their utility in many applications.

SUMMARY OF INVENTION

In one embodiment, an apparatus for sensing rotations is provided. The apparatus generally includes a magnet that generates a first magnetic field and a cell containing at least a vaporized source of alkali atoms and atoms of one or more active nuclear magnetic resonance (NMR) isotopes. The apparatus further includes a light source configured to emit a diverging light that passes through the cell, and one or more photodetectors on a side of the cell opposite the light source, each photodetector configured to detect the diverging light, or a component thereof, that has passed through the cell and to generate a signal indicative of intensity of the detected light. A longitudinal component of the diverging light acts a pump beam for optically pumping the alkali atoms in the cell and, in conjunction with at least a second magnetic field orthogonal to the first magnetic field or a modulation of the diverging light, causing the alkali atoms and the one or more active NMR isotope atoms to precess about the first magnetic field. A transverse component of the diverging light acts as a probe beam for observing the precession about the first magnetic field.

In another embodiment, a method for sensing rotations is provided. The method generally includes applying a first magnetic field, emitting diverging light from a light source, and passing the diverging light through a cell containing at least a vaporized source of alkali atoms and atoms of one or more active nuclear magnetic resonance (NMR) isotopes. Further, the method includes detecting, via one or more photodetectors on a side of the cell opposite the light source, the diverging light, or a component thereof, that has passed through the cell, and determining the rotations based on signals produced by the one or more photodetectors. A longitudinal component of the diverging light acts a pump beam for optically pumping the alkali atoms in the cell and, in conjunction with at least a second magnetic field orthogonal to the first magnetic field or a modulation of the diverging light, causing the alkali atoms and the one or more active NMR isotope atoms to precess about the first magnetic field. A transverse component of the diverging light acts as a probe beam for observing the precession about the first magnetic field.

In yet another embodiment, an apparatus for sensing an external magnetic field is provided. The apparatus generally includes a magnet that generates a first magnetic field and a cell containing at least a vaporized source of alkali atoms. The apparatus further includes a light source configured to emit a diverging light that passes through the cell, and one or more photodetectors on a side of the cell opposite the light source, each photodetector configured to detect the diverging light, or a component thereof, that has passed through the cell and to generate a signal indicative of intensity of the detected light. A longitudinal component of the diverging light acts a pump beam for optically pumping the alkali atoms in the cell and, in conjunction with at least a second magnetic field orthogonal to the first magnetic field or a modulation of the diverging light, causing the alkali atoms to precess about the first magnetic field. A transverse component of the diverging light acts as a probe beam for observing the precession about the first magnetic field.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

Figure 1:
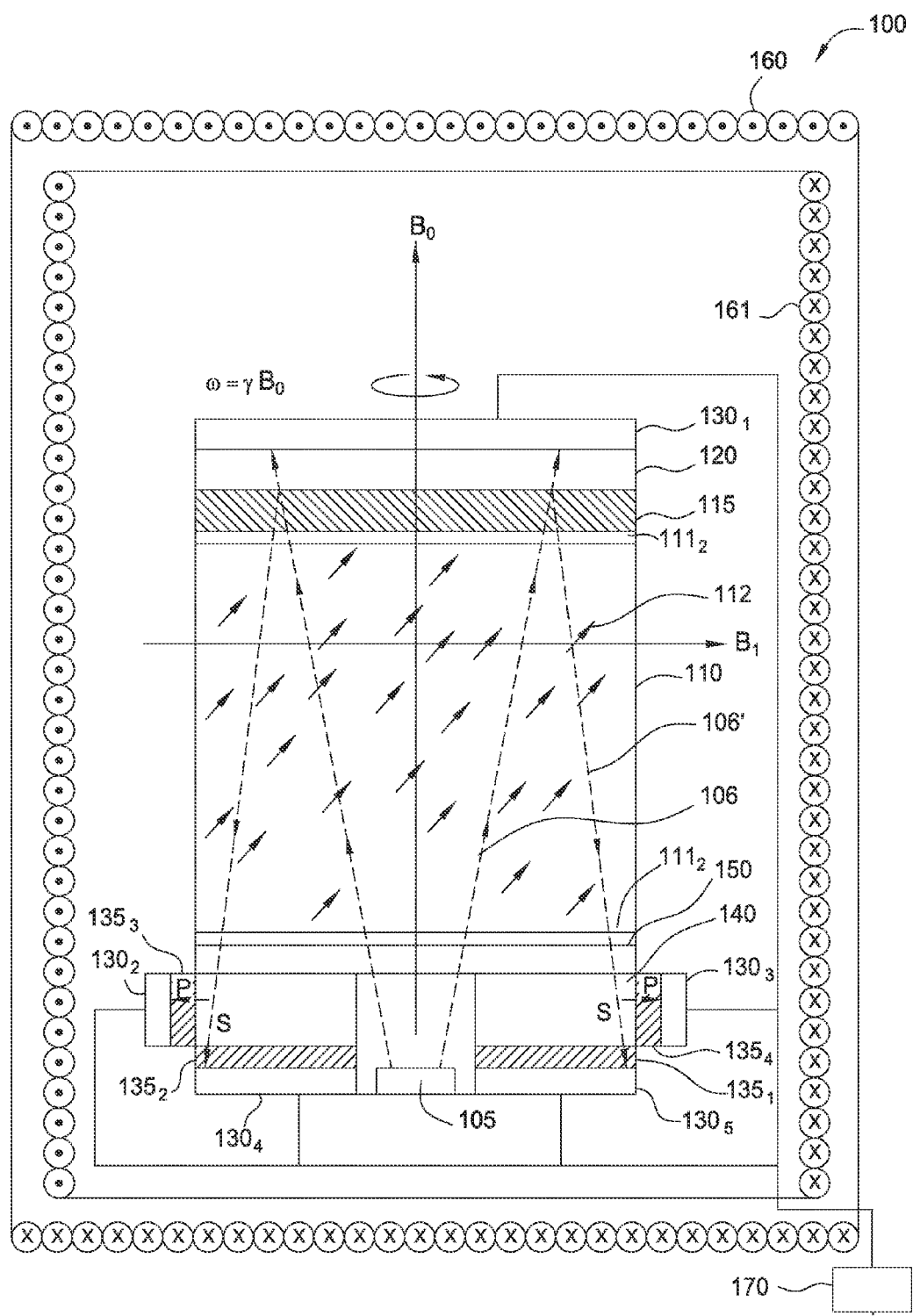
FIG. 1 illustrates a cross-sectional view of a chip-scale atomic device, according to a first embodiment.

Embodiments of the present invention are directed to atomic sensing devices. The atomic sensing devices will be described herein primarily in relation to chip-scale atomic gyroscopes. It is to be understood, however, that embodiments of the atomic sensing devices may be used instead as magnetometers without departing from principles of the present invention.

A first embodiment provides a chip-scale atomic gyroscope having high performance, in terms of bias stability and ARW, as well as small size and low power usage. The chip-scale atomic gyroscope includes a vapor cell forming a closed gas cell containing one or more active NMR isotopes, alkali atoms, and optional buffer gas. The chip-scale atomic gyroscope also includes a light source encircled by a polarization-selective photodetector assembly and a light reflective surface opposite the light source, forming a multiple light path through the vapor cell between the light source, the light reflective surface, and the polarization-selective photodetector assembly. The chip-scale atomic gyroscope further includes a quarter-wavelength optical phase retarder ("quarter-wave plate" or "λ/4 plate") which serves two functions: (1) circularly polarizing diverging light emitted by the light source to produce a pump beam for optically pumping alkali atoms, which in combination with orthogonal magnetic fields (or a modulating of the light from the light source) causes the alkali atoms and NMR isotope atoms to precess about the magnetic field; and (2) rotating the polarization of a returning, linearly polarized probe beam so that the signals arriving at the photodetector assembly produce roughly equal signals in each of the orthogonal polarization channels. Alternatively, the quarter-wave plate may be positioned so that it circularly polarizes light emitted by the light source for optical pumping but does not intersect the probe beam. In addition, the chip-scale atomic gyroscope includes a polarization analyzer comprising four quadrants, each of which is a polarizing beam splitter that separates incident light into S and P components. These S and P component signals may optionally be purified using linear polarizers, and the orthogonal S and P polarizations for each quadrant are then measured to determine a rotation of the polarization of the probe beam due to interactions with precessing atoms in the vapor cell. The rotation of the polarization of the probe beam, as observed in the rotating frame of the gyroscope, may itself be used to determine a rotation of the gyroscope with respect to an inertial frame.

A second embodiment provides a chip-scale atomic gyroscope with similar components as the first embodiment, but with a polarizing beam splitter in lieu of the aforementioned polarization analyzer comprising four quadrants. The polarizing beam splitter splits incident light into S and P components that are measured with respective photodetectors to determine the rotation of the polarization of the probe beam due to interactions with precessing atoms in the vapor cell. The chip-scale atomic gyroscope according to the second embodiment may generally be larger and easier to assemble than the chip-scale atomic gyroscope according to the first embodiment, but the chip-scale atomic gyroscope according to the second embodiment cannot be used to determine rotations in different parts of the device and cannot be configured with its quarter-wavelength plate in different positions, unlike the chip-scale atomic gyroscope according to the first embodiment.

The first and second embodiments, discussed above, employ a folded geometry in which light emitted from a light source is passed through the vapor cell as a pump beam and reflected back through the vapor cell again as a probe beam. Alternatively, a single-pass geometry may be employed in which diverging light emitted from the light source passes through the vapor cell once and is detected on the other side. A third embodiment provides such a chip-scale atomic gyroscope with a single-pass geometry and having high performance, in terms of bias stability and ARW, as well as small size and low power usage. The chip-scale atomic gyroscope includes a vapor cell forming a closed gas cell containing one or more active NMR isotopes, alkali atoms, and optional buffer gas. The chip-scale atomic gyroscope also includes a light source configured to emit a diverging light beam that passes through a quarter-wave plate oriented at 45° relative to the emitted light beam and serving to circularly polarize the light beam for optically pumping alkali atoms in the vapor cell such that the alkali atoms become spin polarized and cause the NMR isotope atoms to become spin polarized as well through spin exchange collisions. Such pumping, in combination with orthogonal magnetic field(s) applied to drive the alkali and NMR isotope atoms (or modulating the light from the light source), causes these atoms to precess about a magnetic field along the axis of the light beam. In addition, the chip-scale atomic gyroscope includes a polarizing beam splitter that separates the circularly polarized light that has passed through the vapor cell into S and P components. The S and P components of light may then be measured using differential detection to determine differential absorption of the light beam as it passed through the vapor cell and interacted with the precessing atoms therein. The differential absorption may itself be used to determine the precession frequency of the atoms and, ultimately, the rotation of the gyroscope with respect to an inertial frame. Note that only a single pass of the circularly polarized light through the vapor cell is needed for pumping purposes and for probing the precession of the atoms in the vapor cell, as a longitudinal component of the circularly polarized light (i.e., a component along the axis of the light) may perform the pumping, while a transverse component of the light (i.e, a component orthogonal to the axis of the light) may be used as the probe beam.

A fourth embodiment provides a chip-scale atomic gyroscope with a single-pass geometry and similar components as the third embodiment, but with the quarter-wave plate moved to be between the vapor cell and the polarizing beam splitter. In this configuration, diverging light emitted by the light source may be linearly polarized by, e.g., a high extinction linear polarizer. Differential absorption by atoms in the vapor cell of left and right circularly polarized components of such a linearly polarized light beam is referred to as circular dichroism and can be measured as a rotation signal. A fifth embodiment provides a chip-scale atomic gyroscope with a single-pass geometry and similar components as the third embodiment, except that the polarizing beam splitter is removed. That is, absorption of circularly polarized light that is passed through the vapor cell is detected using a single photodetector, rather than two photodetectors that detect orthogonally polarized components of such light after the light is split with a polarizing beam splitter.

The design of the chip-scale atomic gyroscopes described herein may be readily modified for use as magnetometers by removing external magnetic shields and/or using alternative gas mixtures in the vapor cell. For example, the magnetometer vapor cell may include alkali atoms and buffer gas, and the magnetometer may measure variations in the strength of the magnetic field based on the observed precession frequency of the alkali atoms in the vapor cell. Generally, the contents of the vapor cell may be chosen to minimize magnetic sensitivity in the chip-scale atomic gyroscopes and enhance magnetic sensitivity in the chip-scale atomic magnetometers.

To better understand the novelty of the atomic sensing devices of the present invention and the methods of use thereof, reference is hereafter made to the accompanying drawings.

Folded Geometry

FIG. 1 illustrates a cross-sectional view of a chip-scale atomic device 100, according to a first embodiment. As shown, the device 100 has a folded geometry and includes a light source 105, a vapor cell 110, a linear polarizer 115, a partial reflector 120, photodetectors $130_{1-5}$, linear polarizers $135_{1-4}$, a polarization analyzer 140, a first magnet 161 generating a first magnetic field $B_0$, a second magnet 160 generating a second magnetic field $B_1$, a quarter-wavelength optical phase retarder (λ/4 plate) 150, and a control circuit 170. The light source 105 may be a semiconductor laser, such as a vertical cavity surface emitting laser (VCSEL) semiconductor laser diode, from which emitted light intrinsically diverges, or the light could be provided by an external laser source and coupled into the gyroscope either though an optical fiber or free-space optical transmission system.

As shown, a central hole in the photodetectors $130_{4-5}$, polarizers $135_{1-2}$, and the polarization analyzer 140 permit light from the light source 105, which is substantially encircled by the photodetectors $130_{4-5}$ forming a quadrant photodiode, to enter the vapor cell 110 via the λ/4 plate 150. In alternative embodiments, the light source 105 may be situated elsewhere. For example, the photodetectors $130_{4-5}$ may lack a central hole in one embodiment and, in such a case, the light source 105 may be situated on top of the photodetectors $130_{4-5}$. Optionally, additional optical components, such as a polarizer and/or lenses, may be incorporated between the light source 105 and the λ/4 plate 150 to improve polarization and/or divergence properties of the light.

In operation, linearly polarized light emitted from the light source 105 passes through the λ/4 plate 150, which is an optical device oriented at a polarization angle of 45° relative to polarization of the emitted light and which circularly polarizes the light. The circularly polarized light 106 then enters the vapor cell 110. The vapor cell 110 may be a closed gas cell containing an atomic gas and having transparent windows $111_{1-2}$ on opposing ends. In one embodiment, the vapor cell 110 may be an anodically bonded cell comprising silicon and Pyrex® windows $111_{1-2}$. The interior of the vapor cell 110 may be coated with a chemical compound (e.g., alkali atoms, or other materials which reduce atomic decoherence) to limit interaction between the gas and the cell walls. Such an anti-relaxation coating serves to preserve atomic spin polarization, although no coating may be used in some embodiments. The vapor cell 110 may include one or more active NMR isotopes, alkali atoms, and buffer gas. Here, the NMR isotopes may be, e.g., noble gases such as $^{129}$Xe and $^{131}$Xe, the alkali atoms may be, e.g., $^{133}$Cs atoms, and the buffer gas may be, e.g., $N_2$. Other NMR isotopes, alkali atoms, and buffer gases may also be used, including well-known ratios of particular atoms, as the design of the chip-scale atomic device 100 is not limited to any choice of vapor atoms.

The circularly polarized light 106 is at a wavelength that is resonant with an optical transition in the alkali atoms and, combined with the magnetic field $B_0$, spin polarizes the alkali atoms. Illustratively, the magnetic field $B_0$ is provided by a surrounding magnet 161 that is a solenoid controlled by the control circuit 170 to produce a null signal, and the magnet 161 may itself be surrounded by a magnetic shield (not shown). Although the magnet 161 is shown as a solenoid, any magnet assembly may be used that is capable of generating a substantially homogenous magnetic field to set a rotation axis along the light beam emitted by the light source 105 and centered on the vapor cell 110. After the alkali atoms are spin polarized, spin exchange collisions transfer the spin polarization of the alkali atoms to the NMR isotopes, such that the NMR isotopes also become spin polarized. By applying a second magnetic field $B_1$ that is orthogonal to the magnetic field $B_0$ and generated by a second solenoid 160 controlled by the control circuit 170 to apply pulses/waveforms (or any other magnet assembly capable of producing a transverse magnetic field pulse/waveform that is perpendicular to light emitted by the light source 105 and centered on gas cell) or, alternatively, modulating the frequency of light from the light source 105 (not shown), similarly responsive to control circuit 170, the spin-polarized atoms in the vapor cell 110 are driven to precess about the magnetic field $B_0$ at frequency $\omega=\gamma B_0$, where γ is the gyromagnetic ratio of the NMR active isotope. The precession of magnetic moments about a magnetic field is generally referred to as Larmor precession. Second magnetic field $B_1$ is preferably of a short time scale, such that the precession frequency is ultimately responsive to magnetic field $B_0$. Although a single second magnetic field $B_1$ is shown, it should be understood that multiple magnetic fields may generally be applied along an axis or axes transverse to the light beam 106, with each magnetic field being at an appropriate frequency to drive one of the types of NMR active atoms in the vapor cell 110. Alternatively, a single magnetic field may be used if a waveform applied to the magnetic field is the sum of the different frequencies needed to drive the different NMR active atoms An observed frequency of Larmor precession in a rotating frame changes with a rotation of the gyroscope relative to the inertial frame. In particular, an atom of interest precesses at observed frequency $$\omega=\gamma B_0+\Omega, \quad (1)$$

where Ω is the rate of rotation of the gyroscope relative to the inertial frame. In an NMR gyroscope, systematic errors in the magnetic field $B_0$ (e.g., variations in the field's strength) may be eliminated by using two types of NMR isotopes, producing the following equations, which permit removal of dependence on $B_0$:

$$\omega_1=\gamma_1 B_0+\Omega,$$

$$\omega_2=\gamma_2 B_0+\Omega. \quad (2)$$

In magnetometer embodiments, variations in the strength of the magnetic field $B_0$ is itself determined based on the precession frequency ω and known values of the gyromagnetic ratio γ and the rate or rotation Ω (e.g., 0), and the vapor cell 110 may include active NMR isotopes (e.g., some alkali) and buffer gas. Complementary to the gyroscope application, two active NMR isotopes may optionally be interrogated in the magnetometer in order to eliminate dependency on Ω. In one magnetometer embodiment, a magnetic shield (not shown) that keeps the magnetic field $B_0$ substantially constant in the NMR gyroscope may be omitted, thereby increasing magnetic field sensitivity.

As shown, the precession frequency(ies) ω ($ω_i$) may be measured by observing a rotation of a polarization of a linearly polarized probe beam 106' that passes through the vapor cell 110 and interacts with atoms therein. Illustratively, a divergent light beam 106, which is emitted from the light source 105 and circularly polarized by the λ/4 plate 150, passes through vapor cell 110. The divergent light beam 106 then passes through a linear polarizer 115 (e.g., a high-extinction ratio linear polarizer) oriented either aligned or orthogonal relative to the initial polarization of the light, as emitted from the light source 105. The linear polarizer 115 filters the light beam 106, letting through light which is substantially linearly polarized along one plane. Such light is then incident on a partial reflector 120 that reflects a small percentage of the light back through the linear polarizer 115 and into the vapor cell 110 as a linearly polarized probe beam 106'. Only a small percentage of light is reflected, such that the probe beam 106' is much weaker than the pump beam 106. In one embodiment, 0.1% of the light is reflected and the remainder is transmitted through the partial reflector 120. The light which is transmitted through the partial reflector 120 may optionally be monitored via a photodetector $130_1$ for purposes of, e.g., diagnostic or laser frequency monitoring.

As shown, the probe beam 106' passes back through the vapor cell 110. Due to the Faraday effect, the polarization of the probe beam 106' is rotated when the probe beam 106' interacts with precessing atoms in the vapor cell 110. This rotation may in turn be observed using the polarization analyzer 140 and photodetectors $130_{2-5}$. In particular, the linear polarizer 115 may be aligned at 0° or 90° with respect to polarization of the light emitted from the light source 105. The probe beam 106' resulting from the double-pass of the linear polarizer 115 would then be equal parts circular left and circular right polarized. The differential absorption between the left and right circularly polarized light of the probe beam 106' is referred to as circular dichroism and appears as a rotation signal that can be measured using the polarization analyzer 140 and the photodetectors $130_{2-5}$.

Before reaching the polarization analyzer 140, the probe beam 106' which has traversed the vapor cell 110 passes through the λ/4 plate 150. The λ/4 plate 150 further rotates the polarization of the incident probe beam 106' by 45° in order to balance the signal observed in each polarization component on the outputs of the polarization analyzer 140 for photodetectors $130_2$ and $130_4$, and photodetectors $130_3$ and $130_5$, each pair of which acts as a balanced photodetector that receives distinct S and P components of the probe beam 106' after those components are split by the polarization analyzer 140. That is, the polarization analyzer 140, which includes four quadrants that are each configured to split incident light into S and P components as discussed in greater detail below, receives light which is rotated by 45° by the λ/4 plate 150 such that the maximum polarization is near balance of each photodetector pair. Note, the S and P designations used herein are somewhat arbitrary, and the S polarized light may be the P polarized light, and vice versa, in other configurations. In the balanced photodetector herein, the signal levels and therefore the signal-to-noise ratio is similar on each detector and noise common to both S and P components (e.g., due to laser intensity variations) may be substantively reduced by differential measurement to improve signal-to-noise ratio, as discussed in greater detail below. Note, the λ/4 plate 150 serves two functions: circularly polarizing light emitted by the light source 105 to produce the pump beam 106, and rotating the returning linearly-polarized probe beam 106' such that S and P components of the rotated light may be used in balanced detection.

Figure 2:
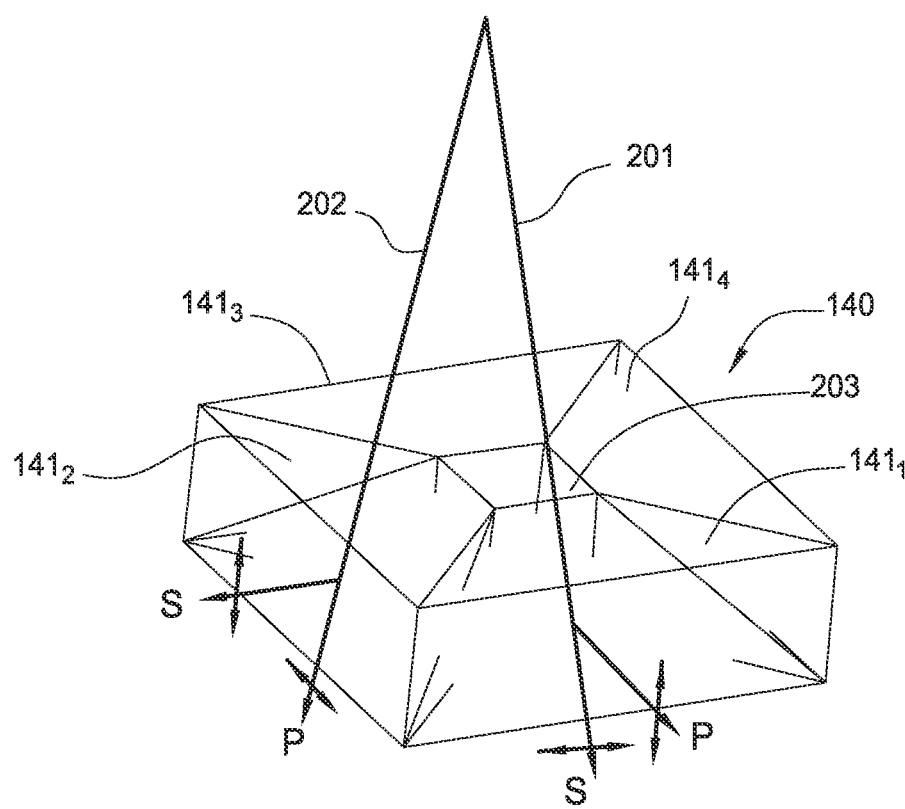
FIG. 2 illustrates a polarization analyzer of the chip-scale atomic device, according to the first embodiment.

As shown, the polarization analyzer 140 receives the probe beam 106' whose polarization is rotated by the λ/4 plate 150, and splits the beam 106' into orthogonal S and P components. One of the polarization components is transmitted through the polarization analyzer 140, while the other is rejected out of the sides of the polarization analyzer 140. Illustratively, the S component is transmitted, while the P component is rejected, although the opposite may also occur, as illustrated in FIG. 2. The key is that S and P components of the probe beam 106' are substantially split and thereafter independently detected. Optionally, linear polarizers $135_{1-4}$ may be placed between the polarization analyzer 140 and the photodetectors $130_{2-5}$ to filter light incident thereon and block light which is not either S or P polarized, as appropriate. For example, the polarizer $135_4$ may be a high-extinction ratio polarizer that blocks S polarized light, thereby filtering the P polarized light passing through polarizer $135_4$ for measurement by the photodetector $130_3$.

In an alternative embodiment, the λ/4-plate 150 may be configured such that it intersects the pump beam 106 but not the returning probe beam 106'. For instance, the λ/4-plate 150 may be placed below the linear polarizers $135_2$ and $135_4$. In such a case, light from the light source 105 passes through the λ/4-plate 150 to become the circularly polarized pump beam used for optical pumping in the vapor cell 110. Upon exiting through the vapor cell 110, however, the pump beam may pass through a linear polarizer similar to linear polarizer 115 but oriented with its principal axis at 45° with respect to the analysis axis of the polarization analyzer 140. The probe beam that returns through the vapor cell 110 would then be linearly polarized at 45°, and the rotation of this linear polarization as the probe beam passes through the gas of the vapor cell 110 may be analyzed by balanced photodetectors to determine a rotation in the plane of polarization. That is, what is measured is birefringence, rather than the circular dichroism discussed above. Note, the returning probe beam 106' would not traverse the λ/4-plate 150 in this configuration, and thus λ/4-plate 150 may be implemented by any circular polarizer, without exceeding the scope. In addition, the birefringence measurement is optimized (i.e., gives the maximum signal) off-resonance, in contrast to the circular dichroism measurement which is optimized on-resonance.

As shown, a first balanced photodetector comprises photodetectors $130_2$ and $130_4$ and a second balanced photodetector comprises photodetectors $130_3$ and $130_5$. Each balanced photodetector includes a pair of photodetectors which are configured to receive respective S and P components of probe beam. For example, a photon incident on the polarization analyzer 140 may be split into an S component transmitted through to the photodetector $130_5$ and a P component rejected out the side of the polarization analyzer 140 to photodetector $130_3$. In one embodiment, the photodetectors $130_3$ and $130_5$ may be connected such that, initially, their photocurrents substantially cancel when observed at 45° relative to the polarization of the probe beam 106'. This is due to the rotation of the probe beam 160' by the λ/4 plate 150 so that the maximum polarization is near balance of the balanced photodetector. As a result, the effective output of the balanced photodetector may be substantially zero, until one of the S and P components changes intensity due to a rotation of the probe beam 106' caused by interaction with atoms in the vapor cell 110 precessing at a different frequency which, as discussed, may occur where the gyroscope 100 is rotated relative to an inertial frame. In this way, rotation of the polarization of the probe beam 106' may be determined, which may, in turn, be used to determine rotation of the gyroscope 100 with respect to the inertial frame according to well-known theory. The control circuit 170 may include a processor (not shown) which performs calculations to make these determinations, and which outputs a signal indicative of determined rotations. In other embodiments, the signals from the photodetectors $130_{2-5}$ may be individually monitored by the control circuit 170 to, e.g., determine a magnetic field gradient across the vapor cell 110.

FIG. 2 illustrates the polarization analyzer 140 of the chip-scale atomic device 100, according to an embodiment. The polarization analyzer 140 may be made from various materials, such as optical glass (e.g., BK7 glass), Pyrex®, quartz, without limitation. As shown, the polarization analyzer 140 includes a central hole 203, through which light from the laser source 105 initially passes, and four quadrants $141_{1-4}$, each of which is a polarizing beam splitter that splits incident light from a returning probe beam 106' (not shown) into S and P components. Any given photon that hits a quadrant of the polarization analyzer 140 is split, and rejected and transmitted in equal ratios to its polarization. More specifically, the statistical probability of detecting a rejected or transmitted photon depends on the polarization of the incident light.

Illustratively, a photon of probe beam 106' traveling along path 201 and incident on quadrant $141_1$ is split into an S component that is transmitted through the quadrant $141_1$ and a P component that is rejected out of the side of the quadrant $141_1$. Similarly, a photon traveling along path 202 and incident on quadrant $141_2$ is split into a P polarization component that is transmitted through the polarization analyzer quadrant $141_2$ and an S polarization component that is rejected out of the side of the quadrant $141_2$. As discussed, the S and P components split by the polarization analyzer 140 may then be optionally filtered by linear polarizers, after which the light is incident on photodetectors used to measure the intensities of those light components. Such intensities generally depend on the orientation of the polarization of the probe beam 106', which is affected by interactions with vapor cell atoms precessing at different frequencies due to different orientations of the gyroscope with respect to an inertial frame, and which may thus be used to determine the rotation of the gyroscope with respect to the inertial frame.

As shown, the polarization analyzer 140 includes four quadrants $141_{1-4}$, each of which may be associated with a respective balanced photodetector. In other embodiments, the polarization analyzer 140 may be divided into more than four polarizing beam splitters, or fewer. Differences in photocurrent signals from different quadrants $141_{1-4}$ may indicate a magnetic field gradient across the vapor cell 110, which is one of the systematic problems in NMR gyroscopes and which causes atoms across the vapor cell to precess at different frequencies. That is, a magnetic field gradient may be determined based on differences in the photodetector signals in different quadrants resulting from atoms precessing at different frequencies due to the magnetic field gradient. In one embodiment, complementary quadrants on opposite sides of the polarization analyzer 140 are monitored to detect magnetic field gradients across the cell. Such magnetic field gradients may then be eliminated by changing the magnetic field by, e.g., applying compensating fields or algorithmically via electronics or firmware. As a result, the impact of magnetic field gradients may be ameliorated for improved ARW and bias stability.

Figure 3:
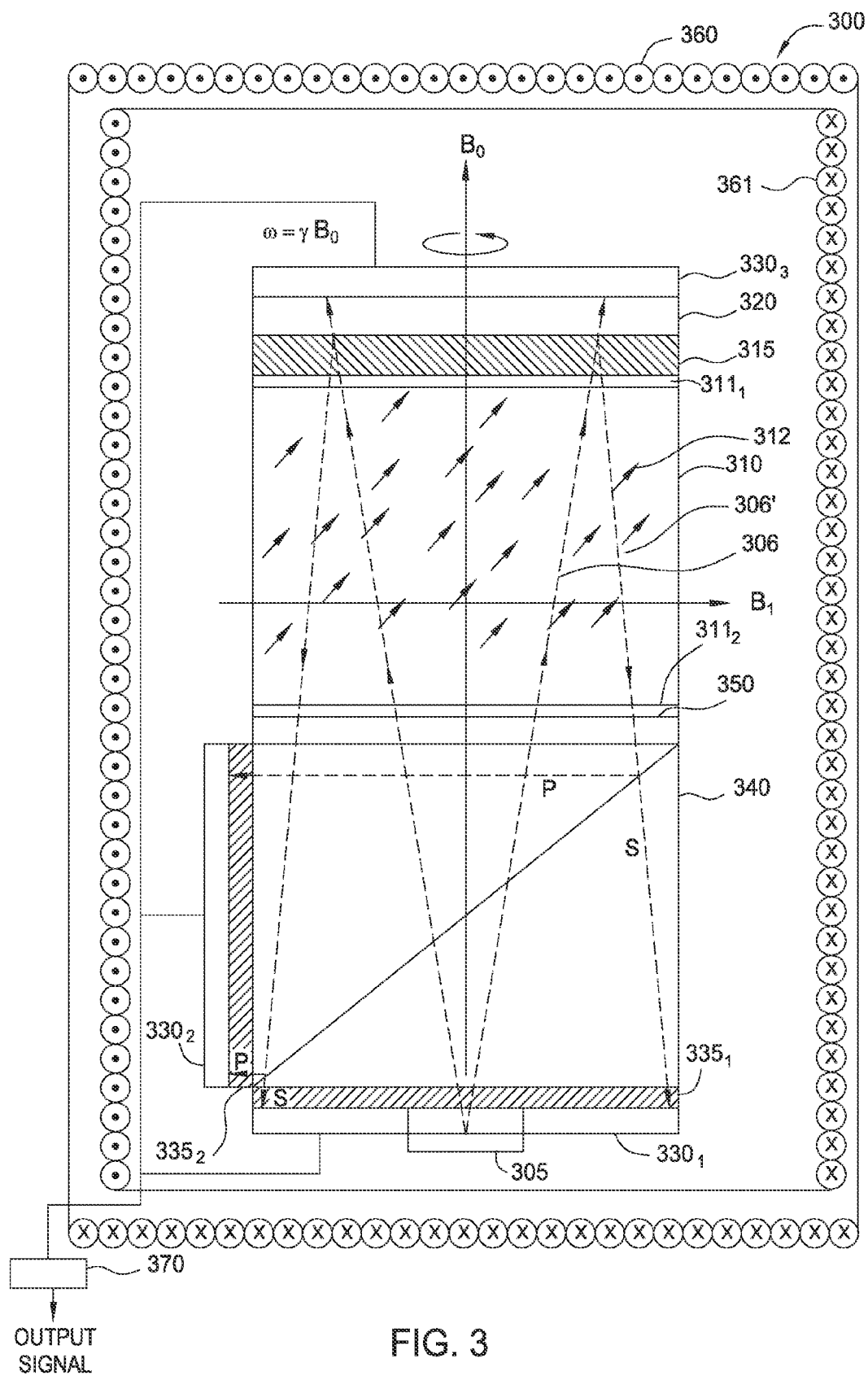
FIG. 3 illustrates a cross-sectional view of a chip-scale atomic device, according to a second embodiment.

FIG. 3 illustrates a cross-sectional view of a chip-scale atomic device 300, according to a second embodiment. The chip-scale atomic device 300 may generally be larger, but easier to assemble, than the chip-scale atomic device 100. As shown, the chip-scale atomic device 300 has a folded geometry and includes a light source 305, a vapor cell 310, a linear polarizer 315, an partial reflector 320, photodetectors $330_{1-3}$, linear polarizers $335_{1-2}$ that are aligned orthogonal to each other, a polarizing beam splitter 340 (e.g., a polarizing beam splitter cube), magnets 360-361, and a quarter-wavelength optical phase retarder ($\lambda/4$ plate) 350 at 45°. The light source 305, vapor cell 310, partial reflector 320, magnets 360-361, and $\lambda/4$ plate 350 are similar to the light source 105, vapor cell 110, partial reflector 120, magnets 160-161, and $\lambda/4$ plate 150, respectively, and descriptions thereof will not be repeated for conciseness.

In operation, light emitted from the light source 305 diverges and passes through a hole in the center of the photodetector $330_1$, as well as the linear polarizer $335_1$ that is aligned for transmission with the polarizing beam splitter 340. The light then enters the vapor cell 310 via the $\lambda/4$ plate 350. Note, although the light source 305 is depicted as being located below the photodetector $330_1$, the light source 305 may be situated elsewhere in alternative embodiments, such as on top of the photodetector $130_1$ if the photodetector $330_1$ did not have a hole. Optionally, additional optical components, such as a polarizer and/or lenses, may be incorporated to improve polarization and/or divergence properties of the light emitted from the light source 305.

The $\lambda/4$ plate 350 circularly polarizes light passing through it, so that light entering the vapor cell 310 comprises a circularly polarized pump beam 306 resonant with an optical transition in alkali atoms of the vapor cell 310. The physics discussed above with respect to the device chip-scale atomic 100 are also applicable to the chip-scale atomic device 300. In particular, the pump beam 306, combined with the magnetic field $B_0$ provided by the magnet 361, spin polarizes alkali atoms in the vapor cell 310, and spin exchange collisions transfer the spin polarization to NMR isotopes in the vapor cell 310. By applying a second magnetic field $B_1$ orthogonal to the magnetic field $B_0$, or alternatively modulating the frequency of light from the light source 305, the spin-polarized atoms in the vapor cell 310 can be driven to precess about the magnetic field $B_0$. The frequency of such precession in a rotating frame changes with a rotation of the device 300 relative to the inertial frame. The rotation of the device 300 relative to the inertial frame may thus be determined from the precession frequency, which can itself be measured by observing a rotation of a polarization of a linearly polarized probe beam 306' as the probe beam 306' passes through the vapor cell 310 and interacts with precessing atoms therein.

As shown, the probe beam 306' is light from circularly polarized pump beam 306 reflected by a partial reflector 320 that is configured to reflect a small percentage of the pump beam 306, which has passed through the linear polarizer 315, back through the linear polarizer 315 and into the vapor cell 310. The photodetector $330_3$ is an optional photodiode that may be included to measure light transmitted by the partial reflector 320 for diagnostic and/or laser frequency monitoring purposes. The linear polarizer 115 is aligned relative to the light emitted from the light source 305 at 0° or 90°, and the double pass through the linear polarizer 315 produces the probe beam 306' with 0° or 90° polarization, i.e., equal parts left and right circular polarization. As the probe beam 306' passes through the vapor cell 310, the polarization of the probe beam 306' becomes elliptical by circular dichroism of the vapor, which involves the differential absorption of the left and right circularly polarized light. After the probe beam 306' passes through the vapor cell 310, the probe beam further passes through the λ/4 plate 350, which splits the two circular components of the probe beam 306' into linear components of light.

The polarizing beam splitter 340 then splits the light into S and P polarization components. Illustratively, the P component is reflected by the polarizing beam splitter 340, and further passes through the polarizer $335_2$ which is a linear polarizer that blocks S polarized light. The remaining light is substantially P polarized and detected by photodetector $330_2$. Likewise, the S component of light is filtered by the polarizer $335_1$ which blocks P polarized light, and the remaining substantially S polarized light is detected by photodetector $330_1$. Similar to the discussion above, the rotation of the polarization of the probe beam 306' may be determined, by a processor (not shown) of the control circuit 370, based on the light detected by the photodetectors $330_{1-2}$ using well-known theory, and the rotation of the polarization of the probe beam 306' may itself be used to determine rotation of the gyroscope 300 with respect to the inertial frame according.

Figure 4:
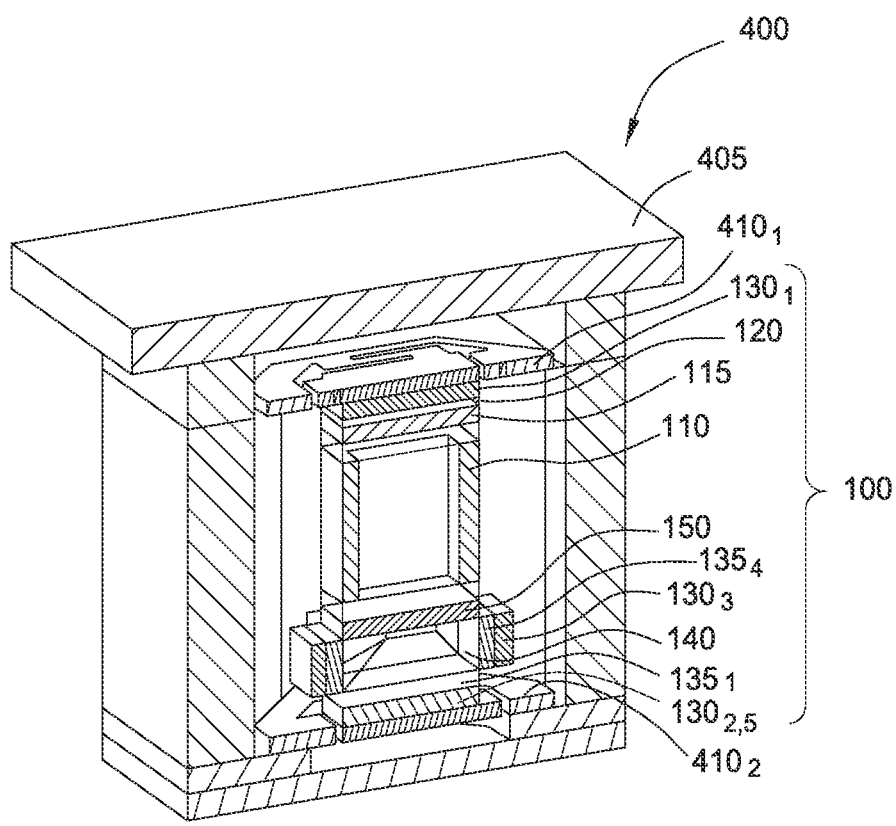
FIG. 4 illustrates a cutaway view of a chip-scale atomic gyroscope package, according to an embodiment.

FIG. 4 illustrates a cutaway view of a chip-scale atomic gyroscope package 400, according to an embodiment. Although the chip-scale atomic gyroscope package 400 is depicted as including the chip-scale atomic device 100, the chip-scale atomic gyroscope package 400 may be configured to include the chip-scale atomic device 300 as well.

As shown, the package 400 includes vacuum packaging 405, which may be fabricated from ceramic, metals, or other non-magnetic materials, in which an NMR gyroscope (or magnetometer) is mounted on a thermal isolation platform $410_2$ and suspended in the vacuum. Here, the thermal isolation platform $410_2$, may be fabricated from, e.g., a thin glass, a polymer such as polyimide, or plastic. In operation, vapor cell 110 of the NMR gyroscope (or magnetometer) may be heated by a heater (not shown) to vaporize atoms in the vapor cell 110. For example, the vapor cell 110 may be heated to 100° C. in one embodiment. The suspension of the NMR gyroscope (or magnetometer) in conjunction with the vacuum in vacuum packaging 405, which reduces heat convection and conduction, may lower power consumption required to heat the vapor cell 110. In one embodiment, the suspension in the package 400 may be accomplished according to techniques disclosed in U.S. Pat. No. 7,215,213 entitled "Apparatus and System for Suspending a Chip-Scale Device and Related Methods," which is hereby incorporated by reference in its entirety. In other embodiments, different suspension techniques, or no suspension, may be used.

In one embodiment, the package 400 may have length, width, and height that are each approximately 7 mm (i.e., FIG. 4 depicts the package 400 cut substantially in half, with the package 400 actually being a 7 mm cube). Other embodiments may have different dimensions. In one embodiment, the NMR gyroscope (or magnetometer) suspended in the vacuum packaging 405 may be the chip-scale atomic device 100 discussed above with respect to FIG. 1. As discussed, the chip-scale atomic device 100 includes a vapor cell 110 which, when used as a gyroscope, contains one or more active NMR isotopes, alkali atoms, and optional buffer gas. The chip-scale atomic gyroscope further includes a light source (not shown) encircled by a polarization-selective photodetector assembly and a light reflective surface 120 opposite the light source, forming a multiple light path through the vapor cell 110 between the light source, the light reflective surface 120, and the polarization-selective photodetector assembly. Diverging light emitted from the light source is initially incident on λ/4 plate 150 which circularly polarizes the light. Combined with a magnetic field $B_0$ provided by, e.g., a surrounding solenoid 161 (not shown) or permanent magnet assembly, the circularly polarized light optically pumps the alkali atoms to become spin polarized. Through spin-exchange collisions with the alkali atoms, the NMR isotope atoms also become spin polarized. By applying an additional magnetic field $B_1$ orthogonal to $B_0$ and generated by a second solenoid 160 (not shown), or modulating the frequency of the light from the light source, the spin-polarized atoms are driven to precess about $B_0$.

As discussed, the pump beam, upon reaching the opposing side of the vapor cell 110, is attenuated, linearly polarized, and reflected back through the vapor cell 110 as a probe beam which interacts with precessing atoms in the vapor cell 110. The returning linearly polarized probe beam passes through the λ/4 plate 150 and is rotated in order to balance the signal observed in each polarization component on the outputs of the polarization analyzer 140. The rotated probe beam is then incident upon the polarization analyzer 140, which may comprise four quadrants, each of which is a polarizing beam splitter that separates incident light into S and P components, which may optionally be purified using, e.g., high-extinction ratio linear polarizers. The orthogonal S and P light components for each quadrant may then be measured using a balanced photodetector to determine a rotation of the polarization of the probe beam due to interactions with precessing atoms in the vapor cell. The rotation of the polarization of the probe beam, as observed in the rotating frame of the gyroscope, may itself be used to determine a rotation of the gyroscope with respect to an inertial frame.

Illustratively, the shape of components of the chip-scale atomic device 100, including the vapor cell 110 and the polarization analyzer 140, are substantially rectangular. This permits the components to be glued together such that relative vibration between components is reduced. As a result, the tight integration between components may provide a low-mass rigid structure for rapid time-to-act and minimal vibration sensitivity.

Figure 5:
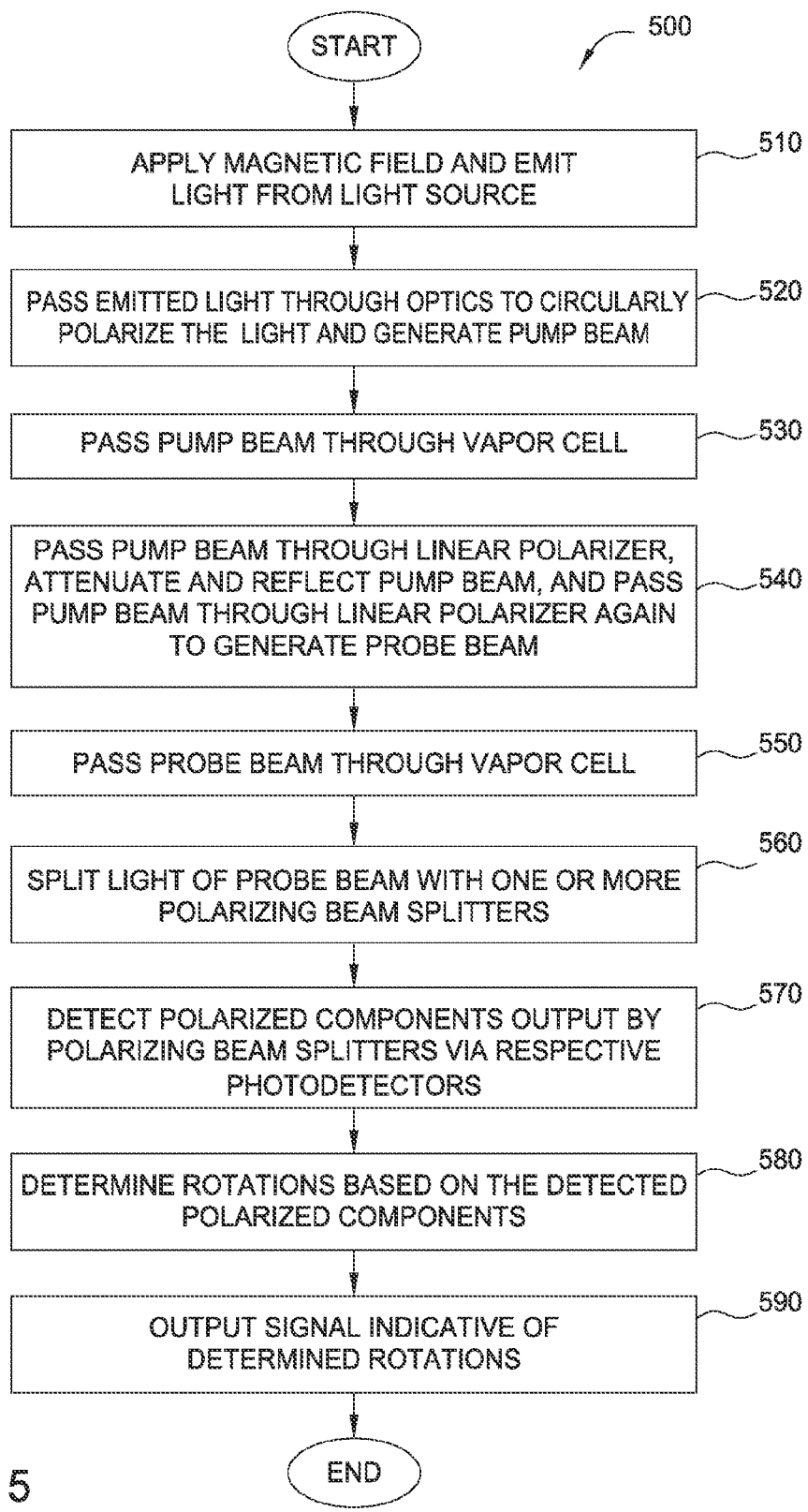
FIG. 5 illustrates a method for sensing rotations of a chip-scale atomic device having a folded geometry, according to an embodiment.

FIG. 5 illustrates a method 500 for sensing rotations of a chip-scale atomic device having a folded geometry, according to an embodiment. As shown, the method 500 begins at step 510, where a first magnetic field (e.g., magnetic field $B_0$) is applied and a light source (e.g., light source 105 or 305) emits light. At step 520, the light emitted by the light source intrinsically diverges and is passed through optics (e.g., λ/4 plate 150 or λ/4 plate 350) to circularly polarize the light and generate a pump beam (e.g., pump beam 106 or 306). As discussed, the optics that circularly polarizes the light may be placed in alternative locations in the geometry of the chip-scale atomic device 100 to measure either circular dichroism or birefringence.

At step 530, the pump beam is passed through a vapor cell (e.g., vapor cell 110 or vapor cell 310). The pump beam acts to optically pump alkali atoms in the vapor cell, which become spin polarized and cause one or more active NMR isotope atoms in the vapor cell to become spin polarized as well through spin-exchange collisions. The spin polarized atoms are then made to precess about the first magnetic field through application of a second magnetic field (e.g., magnetic field $B_1$) orthogonal to the first magnetic field or modulation of the emitted light.

At step 540, the pump beam is further passed through a linear polarizer, attenuated and reflected, and passed back again through the linear polarizer, to generate a probe beam (e.g., probe beam 106' or 306'). The linear polarizer may be aligned at either 0° or 90° relative to the polarization of light emitted from the light source, or at 45°, depending on the placement of the optics that circularly polarizes the light. The probe beam that is generated is then linearly polarized at 0° or 90°, or at 45°, and weaker than the pump beam.

At step 550, the probe beam passes through the vapor cell. As discussed, the probe beam is linearly polarized, and a polarization of the probe beam may be rotated due to the Faraday effect when the probe beam interacts with precessing atoms in the vapor cell. This rotated polarization may, in turn, be observed and used to determine the rotation of the device itself relative to an inertial frame.

At step 560, one or more polarizing beam splitters split light of the probe beam that has passed through the vapor cell. In one embodiment, the polarizing beam splitters may be configured to form a polarization analyzer, such as the polarization analyzer 140. As discussed, the polarization analyzer 140 comprises four polarizing beam splitters that are each configured to split light of the probe beam incident thereon into orthogonally polarized components. In such a case, the probe beam may first pass through the λ/4 plate, which rotates the polarization of the probe beam to balance a signal observed in photodetectors on outputs of the polarization analyzer 140. In an alternative embodiment, the one or more polarizing beam splitters may include a single polarizing beam splitter, such as the polarizing beam splitter 340, which is configured to split light of the probe beam incident thereon into orthogonally polarized components.

At step 570, each of the polarized components output by the one or more polarizing beam splitters is detected using at least one respective photodetector (e.g., photodetectors $130_{2-5}$ or $330_{1-2}$). Optional linear polarizers (e.g., polarizers $135_{2-5}$ or $335_{1-2}$) may be added to filter the polarized components before those components are detected by the photodetectors. Further, an optional photodetector (e.g., photodetector $130_1$ or $330_3$) may be placed to detect light transmitted through the partial detector, discussed above, for diagnostic or laser frequency monitoring.

At step 580, a control circuit or component therein (e.g., a processor of control circuit 170 or 370) determines rotation of the device based on the detected polarized components and well-known theory. Then at step 590, the control circuit or component outputs a signal indicative of the determined rotations. The output signal may be used for navigational purposes, displayed on a display screen, among other things.

Single-Pass Geometry

Figure 6:
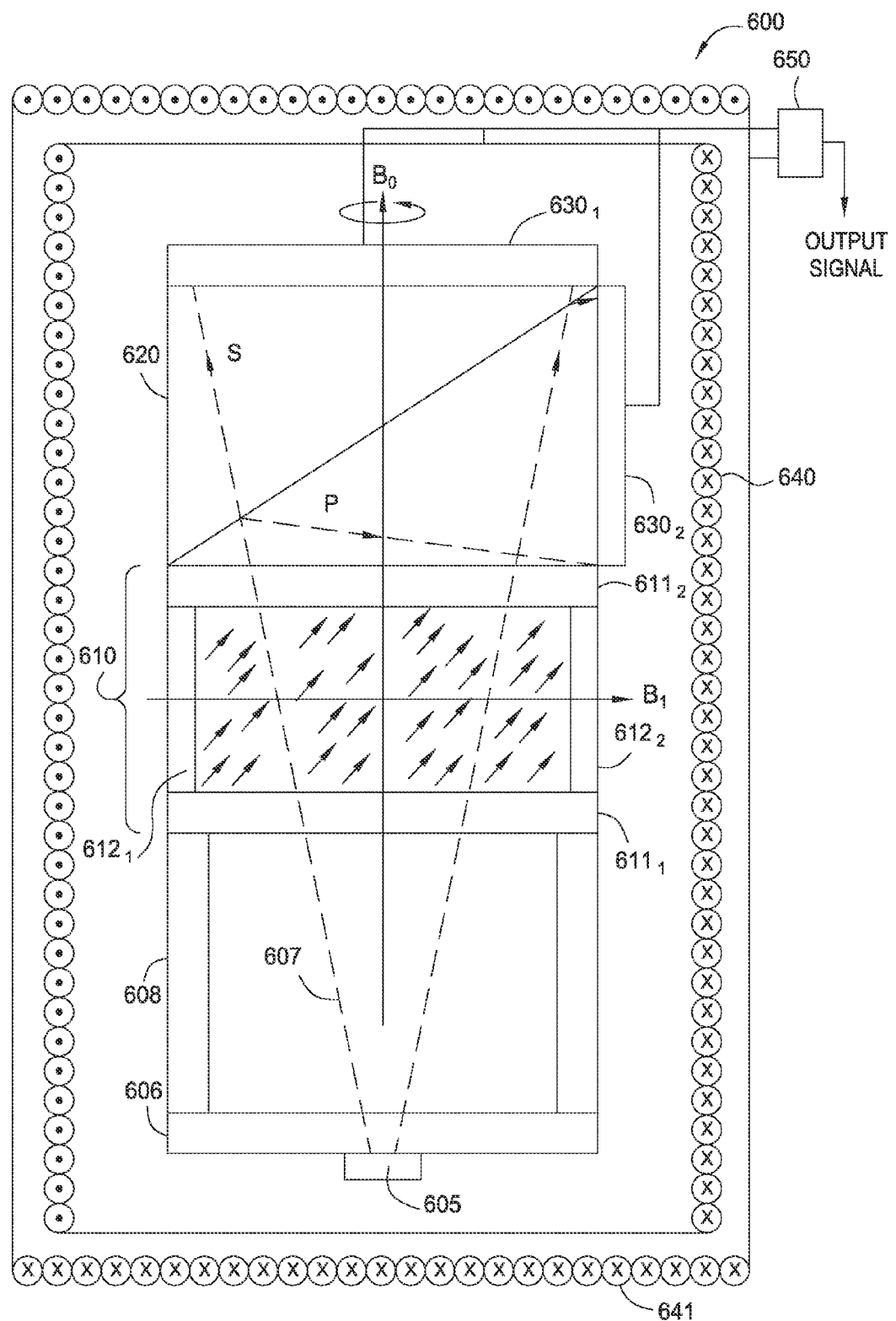
FIG. 6 illustrates a cross-sectional view of a chip-scale atomic device, according to a third embodiment.

FIG. 6 illustrates a cross-sectional view of a chip-scale atomic device 600, according to a third embodiment. It should be understood that chip-scale atomic device 600 and chip scale atomic devices 700 and 800, described below, may be placed in packaging such the chip-scale atomic gyroscope package 400, discussed above. As shown, the device 600 has a single-pass geometry and includes a light source 605, a circular polarizer 606, a spacer element 608, a vapor cell 610, a polarizing beam splitter 620, photodetectors $630_{1-2}$, a first magnet 640 generating a first magnetic field $B_0$, a second magnet 641 generating a second magnetic field $B_1$, and a control circuit 650. The polarizing beam splitter 620 may be implemented as a beam splitter cube. Illustratively, the shape of components of the chip-scale atomic device 600, including the vapor cell 610, the polarizing beam splitter 620, etc. are substantially rectangular. As discussed, this permits the components to be glued together into one piece such that relative vibration between components is reduced. As a result, the tight integration between components may provide a low-mass rigid structure for rapid time-to-act and minimal vibration sensitivity.

Similar to the light source 105, the light source 605 may be a semiconductor laser, such as a VCSEL semiconductor laser diode, from which emitted light intrinsically diverges. Alternatively, light could be provided by an external laser source and coupled into the gyroscope either though an optical fiber or free-space optical transmission system. In operation, linearly polarized light emitted from the light source 605 passes through the circular polarizer 606, which is an optical element that acts to circularly polarize light passing through it. In one embodiment, the circular polarizer may be a quarter-wave plate oriented at a polarization angle of 45° relative to the polarization of the light emitted from the light source 605.

The circularly polarized light 607 then passes through a spacer element 608 before entering the vapor cell 610. The spacer element 608 may be constructed from, e.g., glass or ceramic, and separates the temperature of the light source 605 from that of the vapor cell 610. In order to vaporize atoms in the vapor cell, the vapor cell 610 may be heated to a higher temperature (e.g., 120° C.) than the light source 605 can handle. The spacer element 608 protects the light source 605 from such high temperatures.

The vapor cell 610 is a closed gas cell having transparent windows $611_{1-2}$ on opposing ends. Similar to the vapor cell 110, the vapor cell 610 may be an anodically bonded cell comprising silicon walls $612_{1-2}$ and Pyrex® windows $611_{1-2}$. The interior of the vapor cell 610 may be coated with a chemical compound (e.g., alkali atoms, or other materials which reduce atomic decoherence) to limit interaction between the gas and the cell walls. Such an anti-relaxation coating serves to preserve atomic spin polarization, although no coating may be used in some embodiments. The vapor cell 610 may include one or more active NMR isotopes, alkali atoms, and buffer gas. The NMR isotopes may be, e.g., noble gases such as $^{129}$Xe and $^{131}$Xe, the alkali atoms may be, e.g., $^{133}$Cs atoms, and the buffer gas may be, e.g., $N_2$. Other NMR isotopes, alkali atoms, and buffer gases may also be used, including well-known ratios of particular atoms, as the design of the chip-scale atomic device 600 is not limited to any choice of vapor atoms.

The circularly polarized light 607 may be at a wavelength that is slightly off resonance with an optical transition in the alkali atoms in the vapor cell 610 and, combined with the magnetic field $B_0$, may act to spin polarize the alkali atoms. Illustratively, the magnetic field $B_0$ is provided by a surrounding magnet 640 that is a solenoid controlled by the control circuit 650 to produce a null signal, and the magnet 640 may itself be surrounded by a magnetic shield (not shown). Although the magnet 640 is shown as a solenoid, any magnet assembly may be used that is capable of generating a substantially homogenous magnetic field to set a rotation axis along the light beam emitted by the light source 605 and centered on the vapor cell 610. After the alkali atoms are spin polarized, spin exchange collisions transfer the spin polarization of the alkali atoms to the NMR isotopes, such that the NMR isotopes also become spin polarized. By applying a second magnetic field $B_1$ that is orthogonal to the magnetic field $B_0$ and generated by a second solenoid 641 controlled by the control circuit 650 to apply pulses/waveforms (or any other magnet assembly capable of producing a transverse magnetic field pulse/waveform that is perpendicular to light emitted by the light source 605 and centered on the vapor cell 610) or, alternatively, modulating the frequency of light from the light source 605 (not shown), similarly responsive to control circuit 650, the spin-polarized atoms in the vapor cell 610 are driven to precess about the magnetic field $B_0$ at frequency $\omega = \gamma B_0$, where $\gamma$ is the gyromagnetic ratio of the NMR active isotope. The second magnetic field $B_1$ is preferably of a short time scale, such that the precession frequency is ultimately responsive to the first magnetic field $B_0$. As discussed, multiple magnetic fields may generally be applied along an axis or axes transverse to the light beam 607, with each magnetic field being at an appropriate frequency to drive one of the types of NMR active atoms in the vapor cell 610. Alternatively, a single magnetic field may be used if a waveform applied to the magnetic field is the sum of the different frequencies needed to drive the different NMR active atoms.

The physics discussed above with respect to the device chip-scale atomic 100 are also applicable to the chip-scale atomic device 600. In particular, the Larmor precession frequency(ies) $\omega$ ($\omega_i$) of the atoms in the vapor cell 610 in a rotating frame change with a rotation of the device 300 relative to the inertial frame. The rotation of the device 600 relative to the inertial frame may thus be determined from observed precession frequency(ies). In one embodiment, the Larmor precession frequency(ies) $\omega$ ($\omega_i$) may be measured by observing differential absorption of S and P polarized components of the circularly polarized light beam 607 with photodetectors 630$_{1-2}$. In particular, the light 607 passing through the vapor cell 607 interacts with atoms therein and is differentially absorbed by those atoms. As discussed, only a single pass of the light 607 through the vapor cell is needed for pumping purposes and for probing the precession of the atoms in the vapor cell by interacting with those atoms, as a longitudinal component of the light 607 may perform the pumping, while a transverse component of the light 607 may be used as the probe beam. The differential absorption of the probe beam (i.e., the transverse component of the light 607) is modulated (i.e., changes over time) as a result of Larmor precession of the atoms in the vapor cell 620. This modulated absorption may in turn be detected via photodetectors 630$_{1-2}$ as a sine wave at the Larmor precession frequency. By thus detecting the modulated light absorption and determining the Larmor precession frequency, the rotation of the gyroscope 600 itself may be determined, as discussed above. Further, by splitting the light 607 which has passed through the vapor cell 620 into P and S polarized components, differential detection can be performed, in which common mode noise on the two photodetectors 630$_{1-2}$ are canceled out and the direct current (DC) offset from shining light on the photodetectors 630$_{1-2}$ can also be subtracted out. This improves the signal-to-noise ratio when detecting the modulated absorption of the circularly polarized light 607.

As shown, the circularly polarized light 607 that passes through the vapor cell 610 is incident on the polarizing beam splitter 620, which is configured to split the light 607 into S and P components measured with respective photodetectors 630$_{1-2}$. Illustratively, the P component is reflected by the polarizing beam splitter 620 and detected by photodetector 630$_2$. In contrast, the S component of the light 607 is transmitted through the beam polarizing beam splitter 620 and detected by photodetector 630$_1$. It should be understood that linear polarizers (not shown) may also be placed before the photodetectors 630$_{1-2}$ to further filter the separated components of light to be more S and P polarized.

The signals detected by the photodetectors 630$_{1-2}$ are sent to the control circuit 650, where a processor (not shown) may use the detected signals to observe modulation of light absorption, discussed above, and determine the Larmor precession frequency, from which the rotation of the gyroscope 600 itself may then be determined. As discussed, separate detection of S and P components of the light 607, as illustrated in FIG. 6, is advantageous in that it permits differential detection, in which common mode noise on the two photodetectors 630$_{1-2}$ can be canceled out and the DC offset can also be subtracted out. Further, both the S and P components of every ray of light incident on the polarizing beam splitter 620 is detected, rather than decimating the light into different areas (e.g., light from one side of the cell and from another side of the cell) that are detected by respective photodetectors, as known to the prior art. Such decimation of the light can bias the gyroscope to, e.g., one side of the cell if there are inhomogeneities in the cell.

Figure 7:
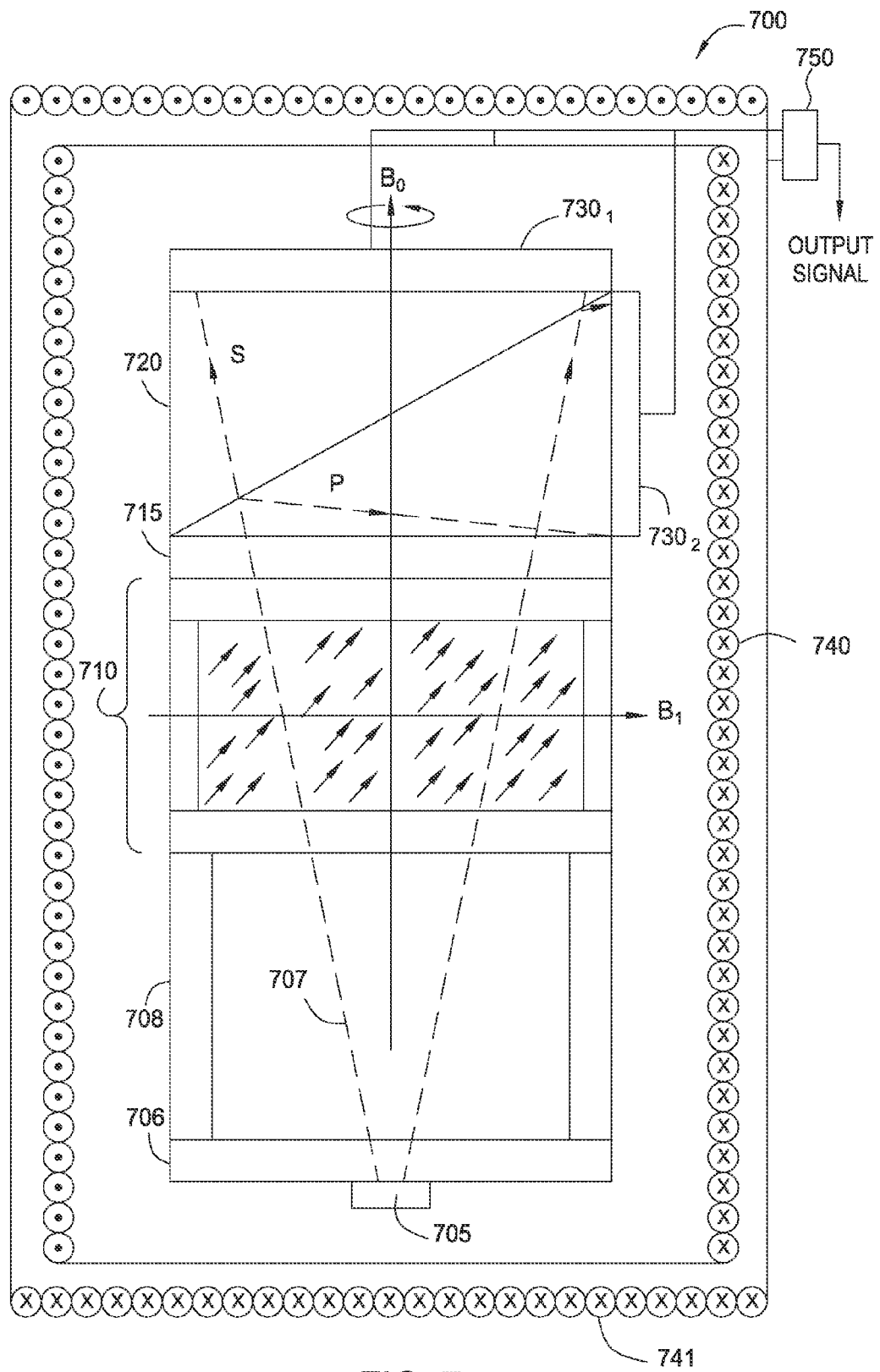
FIG. 7 illustrates a cross-sectional view of a chip-scale atomic device, according to a fourth embodiment.

FIG. 7 illustrates a cross-sectional view of a chip-scale atomic device 700, according to a fourth embodiment. As shown, the device 700 has a single-pass geometry and includes a light source 705, a spacer element 708, a vapor cell 710, a polarizing beam splitter 720, photodetectors 730$_{1-2}$, a first magnet 740 generating a first magnetic field $B_0$, a second magnet 741 generating a second magnetic field $B_1$, and a control circuit 750, which are analogous to the light source 605, spacer element 608, vapor cell 610, polarizing beam splitter 620, photodetectors 630$_{1-2}$, magnets 640 and 641, and control circuit 650 discussed above, and description of which will be omitted for conciseness.

As shown, the chip-scale atomic device 700 further includes a linear polarizer 706 placed in front of the light source 705, as well as a $\lambda/4$ wave retarder 715 that is placed between the vapor cell 710 and the polarizing beam splitter 720. In operation, light emitted from the light source 705 is substantially linearly polarized upon passing through the linear polarizer 706, which is aligned with the light source 705, and forms a substantially linearly polarized light beam 707. The linear polarizer 706 may be, e.g., a high extinction ratio linear polarizer having a higher polarization purity than the light source 705. Differential absorption by atoms in the vapor cell 710 of the left and right circularly polarized components of the linearly polarized light beam 707 is referred to as circular dichroism and appears as a rotation signal that can be measured using the photodetectors 730$_{1-2}$. That is, the left and right circularly polarized components of the linearly polarized light 707 are differentially absorbed and subsequently mapped onto the two photodetectors 730$_{1-2}$, and such differential absorption may be used to determine the Larmor precession frequency and, ultimately, the rotation of the gyroscope 700 itself using well-known theory. In an alternative embodiment, the linear polarizer 706 may be omitted and replaced with, e.g., a simple piece of glass, if the light emitted by the light source 705 is already sufficiently linearly polarized.

The $\lambda/4$ wave retarder 715 acts to rotate light incident thereon by 45° such that the maximum polarization is near balance of the photodetector pair 730$_{1-2}$. As a result, the control circuit 750 may perform balanced detection to improve the signal-to-noise ratio by, e.g., canceling out noise and eliminating a DC offset.

Figure 8:
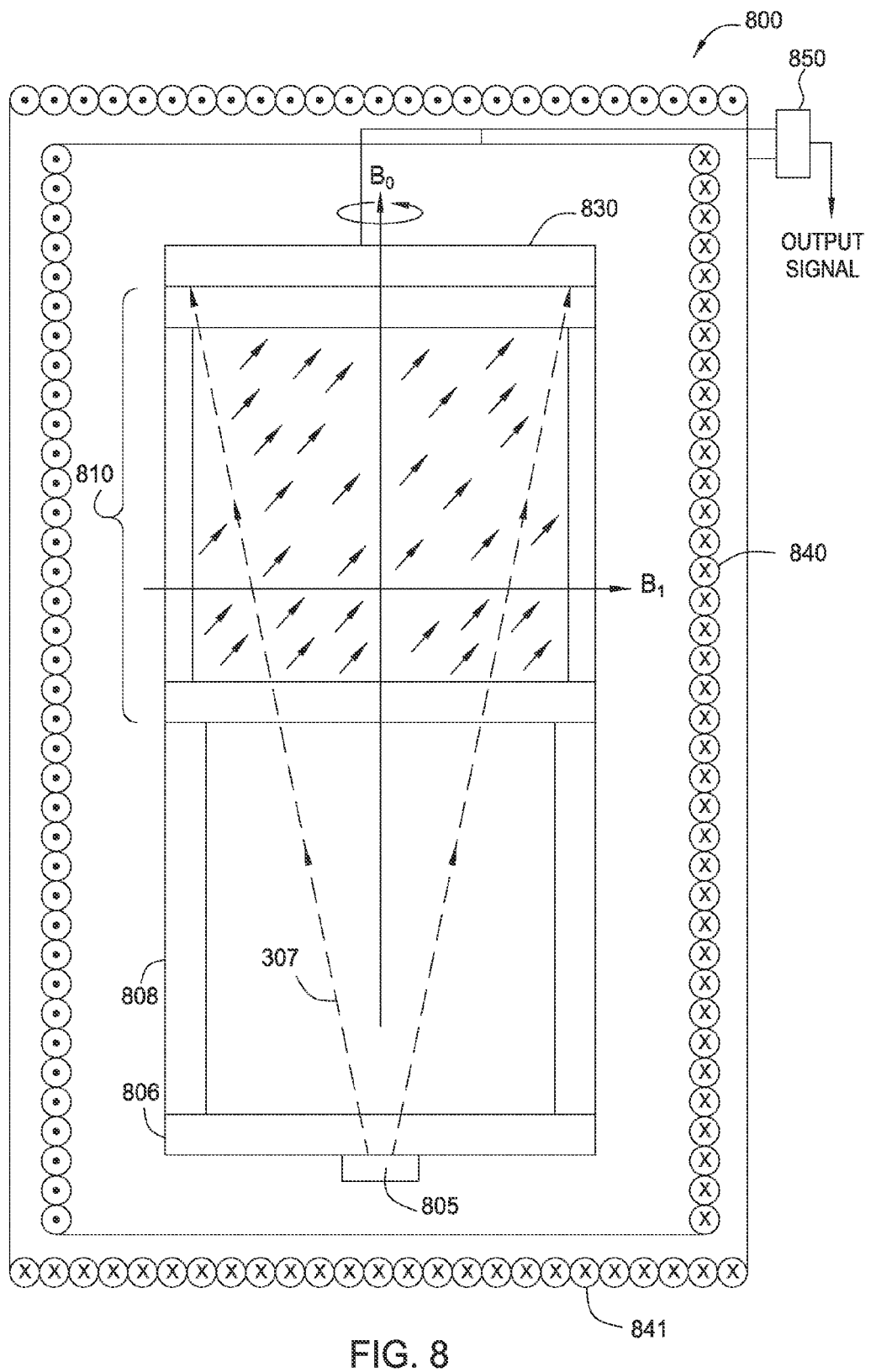
FIG. 8 illustrates a cross-sectional view of a chip-scale atomic device, according to a fifth embodiment.

FIG. 8 illustrates a cross-sectional view of a chip-scale atomic device 800, according to a fifth embodiment. As shown, the device 800 has a single-pass geometry and includes a light source 805, a spacer element 808, a vapor cell 810, a circular polarizer 806, a first magnet 840 generating a first magnetic field $B_0$, a second magnet 841 generating a second magnetic field $B_1$, a photodetector 830, and a control circuit 850, which are analogous to the light source 605, spacer element 608, vapor cell 610, circular polarizer 606, polarizing beam splitter cube 620, magnets 640 and 641, and control circuit 650 discussed above, and description of which will be omitted for conciseness.

As shown, the chip-scale atomic device 800 is substantially identical to the chip-scale atomic device 600 discussed above with respect to FIG. 6, except that the polarizing beam splitter 620 is missing. As discussed, the polarizing beam splitter 620 splits circularly polarized light which has passed through the vapor cell 610 into S and P polarized components for separate detection by photodetectors $630_{1-2}$, and separate detection of such S and P components is advantageous in that it permits common mode noise to be canceled out and the DC offset to be subtracted out. Where there is a sufficiently strong signal, however, it may be desirable to remove the polarizing beam splitter 620 to, e.g., reduce costs. In such a case, illustrated in FIG. 8, the modulated light absorption by the vapor cell 810 atoms may be detected via the single photodetector 830. The control circuit 850 may then use the signal produced by the photodetector 830 to determine the Larmor precession frequency and, ultimately, the rotation of the gyroscope 800.

Figure 9:
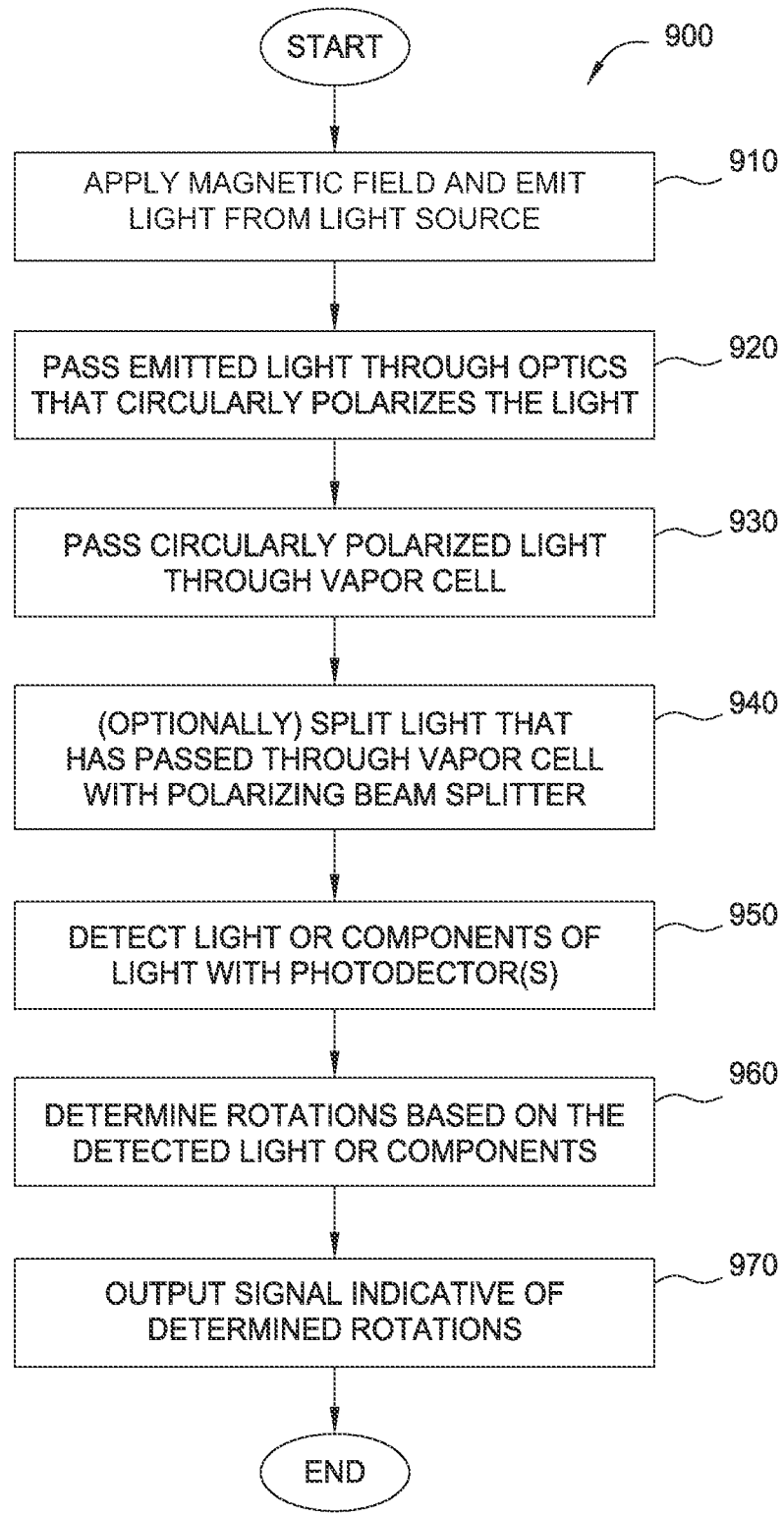
FIG. 9 illustrates a method for sensing rotations of a chip-scale atomic device having a single-pass geometry, according to an embodiment.

FIG. 9 illustrates a method 900 for sensing rotations of a chip-scale atomic device having a single-pass geometry, according to an embodiment. As shown, the method 900 begins at step 910, where a first magnetic field (e.g., magnetic field $B_0$) is applied and a light source (e.g., light source 605 or 805) emits light that intrinsically diverges. At step 920, the light emitted by the light source is passed through optics (e.g., circular polarizer 606 or 806) to circularly polarize the light.

At step 930, the circularly polarized light beam is passed through a vapor cell (e.g., vapor cell 610 or 810). In one embodiment, the circularly polarized light may first pass through a spacer element separating the light source from the vapor cell. Upon entering the vapor cell, the circularly polarized light beam acts to optically pump alkali atoms in the vapor cell, which become spin polarized and cause one or more active NMR isotope atoms in the vapor cell to become spin polarized as well through spin-exchange collisions. As discussed, a longitudinal component of the circularly polarized light beam may be used for such pumping, while a transverse component of the circularly polarized light may be used as a probe beam. The atoms in the vapor cell that are spin polarized by pumping are further driven to precess about the first magnetic field through application of a second magnetic field or fields (e.g., magnetic field $B_1$) orthogonal to the first magnetic field, or by modulation of the emitted light.

At step 940, an optional polarizing beam splitter (e.g., polarizing beam splitter 620) splits light of the light beam that has passed through the vapor cell into orthogonally polarized components. As discussed, such orthogonally polarized components may be used for differential detection of absorption of the light beam by atoms in the vapor cell. In such differential detection, signal-to-noise ratio is improved by canceling out common mode noise and subtracting out a DC offset in signals provided by a pair of photodetectors. In an alternatively embodiment, the polarizing beam splitter may be removed and a single photodetector used to determine modulated absorption of the light beam.

At step 950, each of the polarized components output by the polarizing beam splitter, or the light beam itself that has passed through the vapor cell if no polarizing beam splitter is used, is detected using photodetector(s) (e.g., photodetectors $630_{1-2}$, or 830). The photodetectors, which may be typical photodiodes, are configured to generate signals indicative of the intensity of light incident thereon. Optionally, linear polarizers may be added to filter the polarized components before those components are detected by the photodetectors.

At step 960, a control circuit or component therein (e.g., a processor of control circuit 650 or 850) determines rotation of the device based on the light detected by the photodetectors and by applying well-known theory relating modulation of the detected absorption signal to the Larmor procession frequency and, ultimately, to rotation of the gyroscope relative to an inertial frame. Then at step 970, the control circuit or component outputs a signal indicative of the determined rotations. The output signal may be used for navigational purposes, displayed on a display screen, among other things.

Figure 10:
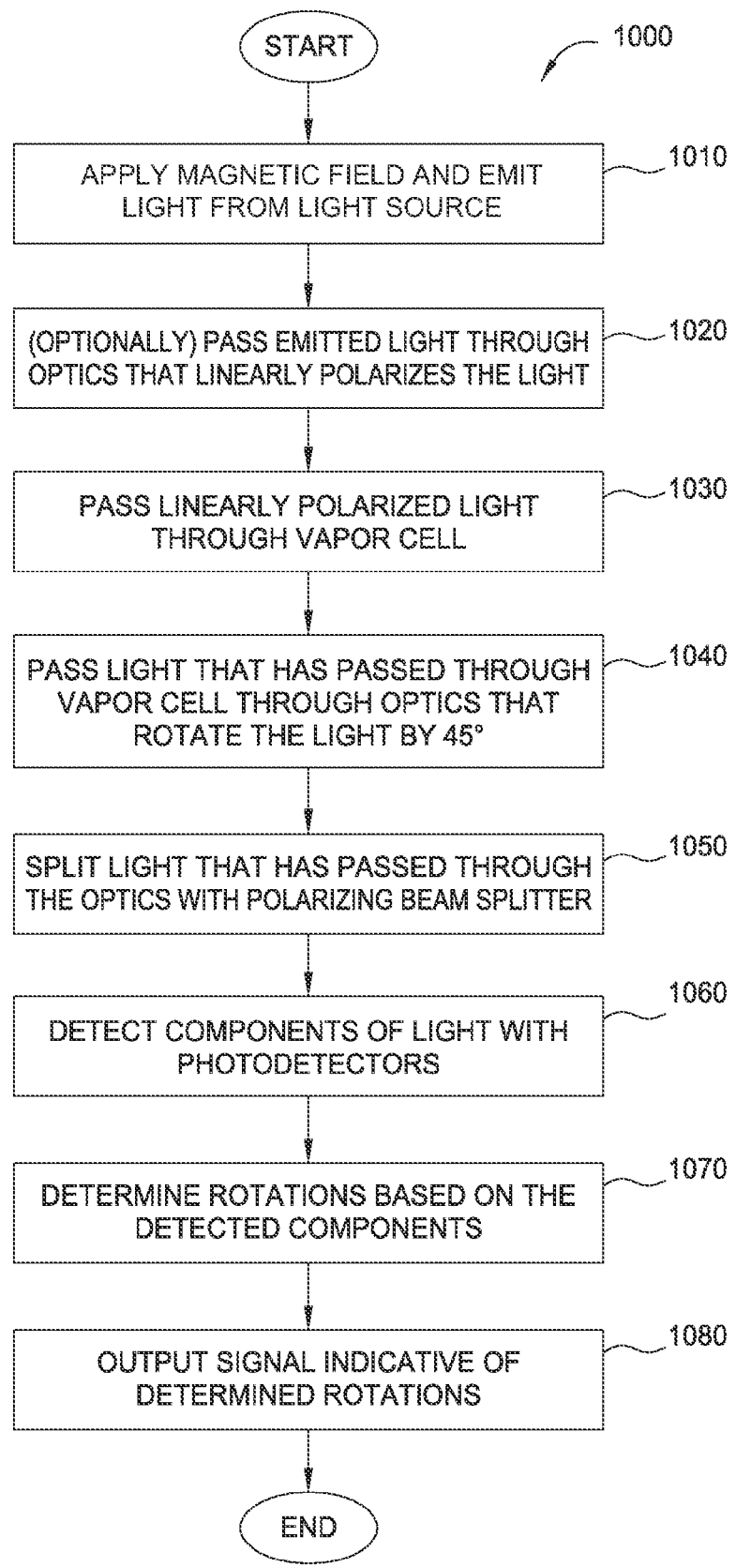
FIG. 10 illustrates a method for sensing rotations of another chip-scale atomic device having a single-pass geometry, according to an embodiment.

FIG. 10 illustrates a method 1000 for sensing rotations of a chip-scale atomic device having another single-pass geometry, according to an embodiment. As shown, the method 1000 begins at step 1010, where a first magnetic field (e.g., magnetic field $B_0$) is applied and a light source (e.g., light source 605 or 805) emits light that intrinsically diverges. At step 1020, the light emitted by the light source is optionally passed through optics (e.g., linear polarizer 706) to further linearly polarize the light.

At step 1030, the linearly polarized light beam is passed through a vapor cell (e.g., vapor cell 710). In one embodiment, the linearly polarized light may first pass through a spacer element separating the light source from the vapor cell. Upon entering the vapor cell, the linearly polarized light beam may optically pump alkali atoms in the vapor cell, which may then become spin polarized and cause one or more active NMR isotope atoms in the vapor cell to become spin polarized as well through spin-exchange collisions. The atoms in the vapor cell that are spin polarized by pumping are further driven to precess about the first magnetic field through application of a second magnetic field or fields (e.g., magnetic field $B_1$) orthogonal to the first magnetic field, or by modulation of the emitted light. Similar to the discussion above, a longitudinal component of the linearly polarized light may act as a pump beam, and a transverse component of the linearly polarized light may act as a probe beam for observing the precession about the first magnetic field.

At step 1040, the linearly polarized light that has passed through the vapor cell is further passed through optics (e.g., $\lambda/4$ wave retarder 715) to rotate the polarization of the light by 45°. As discussed, this rotation of the light's polarization by 45° permits the maximum polarization to be near balance of a pair of photodetectors (e.g., photodetector pair $730_{1-2}$). Balanced detection may then be performed to improve the signal-to-noise ratio by, e.g., canceling out noise and eliminating a DC offset.

At step 1050, a polarizing beam splitter (e.g., polarizing beam splitter 720) splits light of the light beam that has passed through the vapor cell into orthogonally polarized components. As discussed, such orthogonally polarized components may be used for differential detection of absorption of the light beam by atoms in the vapor cell. In such differential detection, signal-to-noise ratio is improved by canceling out common mode noise and subtracting out a DC offset in signals provided by a pair of photodetectors. In an alternatively embodiment, the polarizing beam splitter may be removed and a single photodetector used to determine modulated absorption of the light beam.

At step 1060, each of the polarized components output by the polarizing beam splitter is detected using photodetectors (e.g., photodetectors $730_{1-2}$). The photodetectors, which may be typical photodiodes, are configured to generate signals indicative of the intensity of light incident thereon. Optionally, linear polarizers may be added to filter the polarized components before those components are detected by the photodetectors.

At step 1070, a control circuit or component therein (e.g., a processor of control circuit 750) determines rotation of the device based on the light detected by the photodetectors and by applying well-known theory for circular dichroism and relating observed Larmor procession frequency to rotation of the gyroscope relative to an inertial frame. Then at step 1080, the control circuit or component outputs a signal indicative of the determined rotations. As discussed, the output signal may be used for navigational purposes, displayed on a display screen, among other things.

As previously noted, the designs of the chip-scale atomic gyroscopes described herein and the associated method for measuring rotations may be readily modified for use as magnetometers for measuring strength and/or rotation of an external magnetic field by removing magnetic shields, and the magnetometers may also use alternative gas mixtures in the vapor cells. For example, a magnetometer vapor cell may include alkali atoms and buffer gas, and the magnetometer may measure variations in the strength of the magnetic field which affects the precession frequency of the alkali atoms in the vapor cell.

Advantageously, embodiments disclosed herein provide high-performance gyroscopes which are compact, low-power, and relatively inexpensive to manufacture. Alternative magnetometer embodiments provide similar performance, power, size, and cost advantages. Such chip-scale gyroscopes and magnetometers may have a number of applications, such as navigation, and may be used in situations unsuitable for larger, power-hungry gyroscopes and magnetometers, such as personal use by individuals who carry the devices.

While the forgoing is directed to embodiments of the present invention, other and further embodiments of the invention may be devised without departing from the basic scope thereof.

What is claimed is:

1. An apparatus for sensing rotations, the apparatus comprising:
   a magnet that generates a first magnetic field;
   a cell containing at least a vaporized source of alkali atoms and atoms of one or more active nuclear magnetic resonance (NMR) isotopes;
   a light source configured to emit a diverging light that passes through the cell;
   a polarizing beam splitter opposite the light source and configured to split the diverging light that has passed through the cell into orthogonally polarized components; and
   a plurality of photodetectors, each of the photodetectors being configured to detect one of the orthogonally polarized components of the light that has passed through the cell and been split by the polarizing beam splitter and to generate a respective signal indicative of intensity of detected light for use in differential detection,
   wherein a longitudinal component of the diverging light acts as a pump beam for optically pumping the alkali atoms in the cell and, in conjunction with at least a second magnetic field orthogonal to the first magnetic field or a modulation of the diverging light, causing the alkali atoms and the one or more active NMR isotope atoms to precess about the first magnetic field, and
   wherein a transverse component of the diverging light acts as a probe beam for observing the precession about the first magnetic field.

2. The apparatus of claim 1, further comprising, a circular polarizer configured to circularly polarize the diverging light prior to the diverging light entering the cell.

3. The apparatus of claim 2, wherein the circular polarizer is a quarter-wavelength optical phase retarder oriented at 45 degrees relative to polarization of the diverging light emitted from the light source.

4. The apparatus of claim 1, further comprising, a linear polarizer configured to linearly polarize the diverging light prior to the diverging light entering the cell.

5. The apparatus of claim 4, further comprising, a quarter-wavelength optical phase retarder configured to rotate polarization of the diverging light that has passed through the cell by 45° for balanced detection with the photodetectors.

6. The apparatus of claim 1,
   wherein the cell, the polarizing beam splitter, and the photodetectors are substantially rectangular, and
   wherein the cell, the light source, the polarizing beam splitter, and the photodetectors are glued together into one piece.

7. The apparatus of claim 1, wherein one or more walls of the cell include anti-relaxation coating.

8. The apparatus of claim 1, further comprising, a spacer element between the light source and the cell.

9. A method for sensing rotations, the method comprising:
   applying a first magnetic field;
   emitting diverging light from a light source;
   passing the diverging light through a cell containing at least a vaporized source of alkali atoms and atoms of one or more active nuclear magnetic resonance (NMR) isotopes;
   splitting, via a polarizing beam splitter opposite the light source, the diverging light that has passed through the cell into orthogonally polarized components;
   detecting, via a plurality of photodetectors, the orthogonally polarized components, wherein each of the photodetectors detects one of the orthogonally polarized components of the light that has passed through the cell and been split by the polarizing beam splitter and generates a respective signal indicative of intensity of detected light; and
   determining using differential detection the rotations based on the signals produced by the photodetectors,
   wherein a longitudinal component of the diverging light acts as a pump beam for optically pumping the alkali atoms in the cell and, in conjunction with at least a second magnetic field orthogonal to the first magnetic field or a modulation of the diverging light, causing the alkali atoms and the one or more active NMR isotope atoms to precess about the first magnetic field, and
   wherein a transverse component of the diverging light acts as a probe beam for observing the precession about the first magnetic field.

10. The method of claim 9, further comprising, circularly polarizing the diverging light prior to the diverging light entering the cell.

11. The method of claim 10, wherein the diverging light is circularly polarized by a quarter-wavelength optical phase retarder oriented at 45 degrees relative to polarization of the diverging light emitted from the light source.

12. The method of claim 9, further comprising, linearly polarizing the diverging light prior to the diverging light entering the cell.

13. The method of claim 12, further comprising, rotating polarization of the diverging light that has passed through the cell by 45° for balanced detection with the photodetectors.

14. The method of claim 9,
wherein the cell, the polarizing beam splitter, and the photodetectors are substantially rectangular, and
wherein the cell, the light source, the polarizing beam splitter, and the photodetectors are glued together into one piece.

15. The method of claim 9, wherein one or more walls of the cell include anti-relaxation coating.

16. The method of claim 9, further comprising, passing the diverging light emitted from the light source through a spacer element between the light source and the cell.

17. An apparatus for sensing an external magnetic field, the apparatus comprising:

a magnet that generates a first magnetic field;
a cell containing at least a vaporized source of alkali atoms;
a light source configured to emit a diverging light that passes through the cell;
a polarizing beam splitter opposite the light source and configured to split the diverging light that has passed through the cell into orthogonally polarized components; and
a plurality of photodetectors, each of the photodetectors being configured to detect one of the orthogonally polarized components of the light that has passed through the cell and been split by the polarizing beam splitter and to generate a respective signal indicative of intensity of detected light for use in differential detection,
wherein a longitudinal component of the diverging light acts as a pump beam for optically pumping the alkali atoms in the cell and, in conjunction with at least a second magnetic field orthogonal to the first magnetic field or a modulation of the diverging light, causing the alkali atoms to precess about the first magnetic field, and
wherein a transverse component of the diverging light acts as a probe beam for observing the precession about the first magnetic field.

* * * * *